United States Patent [19]

Mosier et al.

[11] Patent Number: 4,495,639

[45] Date of Patent: Jan. 22, 1985

[54] ELECTRONIC DATA COMPRESSOR

[75] Inventors: John E. Mosier; Jim B. Surjaatmadja; George B. McLawhon, all of Duncan, Okla.

[73] Assignee: Halliburton Company, Duncan, Okla.

[21] Appl. No.: 355,318

[22] Filed: Mar. 8, 1982

[51] Int. Cl.³ .............................................. G10L 1/00
[52] U.S. Cl. ...................................................... 381/51
[58] Field of Search ........................ 375/122; 381/51; 358/261

[56] References Cited

U.S. PATENT DOCUMENTS

| | | | |
|---|---|---|---|
| 3,435,134 | 3/1969 | Richards | 375/122 |
| 3,457,544 | 7/1969 | Miller et al. | |
| 3,553,362 | 1/1971 | Mounts | 375/122 |
| 3,609,244 | 9/1971 | Mounts | 375/122 |
| 3,872,248 | 3/1975 | Winters | 178/7.6 |
| 3,876,825 | 4/1975 | Murakami et al. | 178/6 |
| 3,882,305 | 5/1975 | Johnston | |
| 3,955,045 | 5/1976 | Ford, Jr. | 178/6 |
| 4,020,462 | 4/1977 | Morrin | |
| 4,297,727 | 10/1981 | Ogawa et al. | 358/261 |
| 4,312,040 | 1/1982 | Tinch et al. | |
| 4,327,379 | 4/1982 | Kadakia et al. | 358/261 |
| 4,335,277 | 6/1982 | Puri | 381/51 |

Primary Examiner—E. S. Matt Kemeny
Attorney, Agent, or Firm—William J. Beard

[57] ABSTRACT

A data compressor includes circuit elements for counting the number of bytes transmitted in a binary bit stream and further includes storage circuit elements for temporarily storing each byte transmitted in the stream and the corresponding byte count of each byte. The data compressor also includes combinational logic control circuitry for detecting when one of the bits in a temporarily stored byte has a predetermined logic value and for generating a retain data control signal for signalling that the byte contains data desired to be retained.

5 Claims, 1 Drawing Figure

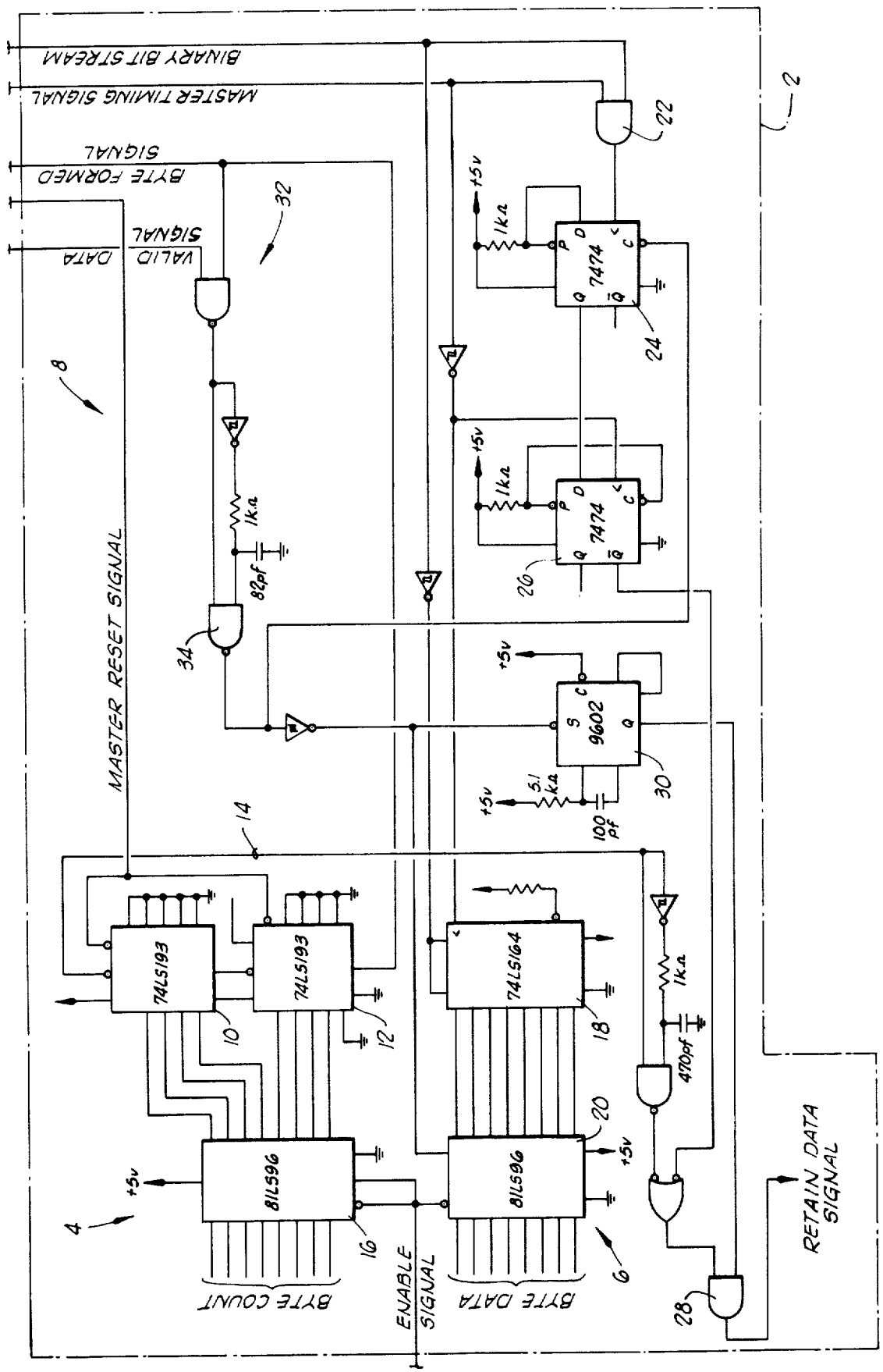

ELECTRONIC DATA COMPRESSOR

This invention relates generally to electronic data compressors and more particularly, but not by way of limitation, to an electrical circuit for detecting when a byte of binary bits includes at least one bit having a predetermined logic value and for providing a control signal to retain each such byte for subsequent transmission or other use.

In transmitting data which has been digitally encoded, an extended period of time may be required to transmit the data because of the quantity of data to be transferred and/or because of the limited bandwidth of the transmission means, (e.g., the commercial telephone system is limited to transmission rates of a few hundred baud). Such an extended period of time may be undesirable if rapid transmission is needed or if costs, such as long distance telephone tolls, are to be reduced.

To reduce the transmission time and the associated costs, either the quantity of data to be transmitted can be reduced or the bandwidth of the transmission means can be increased. Because the latter of these two possibilities is often difficult to realize for the entity desiring to transmit data, there is the need for some means of realizing the former possibility. That is, there is the need for a data compressor means for reducing the quantity of data to be transmitted by the transmission means.

Because the data to be transmitted may include information which need not be transmitted and which if transmitted would slow the transmission time for the pertinent information, it is desirable that the data compressor means include means for relatively quickly and automatically detecting the pertinent information and means for providing a signal to retain such pertinent information and to discard the remainder, thereby compressing the quantity of data to be transmitted or otherwise used.

It is also desirable to implement such means with electronic circuits (i.e., hardware instead of firmware or software) to obviate the need for a computer to operate the means.

It is to such a data compressor means that the present invention is directed. For the disclosure of an example of an overall system in which the present invention is contemplated to be used, reference can be made to the copending application of John E. Mosier, Jim B. Surjaatmadja, George B. McLawhon and Jack C. Penn entitled DATA CONVERSION, COMMUNICATION AND ANALYSIS SYSTEM filed Mar. 8, 1982, and given Ser. No. 355,317.

The present invention provides a novel and improved electronic data compressor apparatus. This apparatus comprises means for detecting those ones of a stream of binary bits having a predetermined one of two logic values and for retaining those detected ones for subsequent transmission or other use.

Therefore, from the foregoing it is a general object of the present invention to provide a novel and improved electronic data compressor. Other and further objects, features and advantages of the present invention will be readily apparent to those skilled in the art when the following description of the preferred embodiment is read in conjunction with the accompanying drawing.

The drawing is a schematic circuit diagram of the preferred embodiment of the present invention.

With reference to the drawing the preferred embodiment of the present invention will be described. The drawing discloses a data compressor means 2 constructed in accordance with the present invention. The data compressor means 2 provides means for passing or transferring to a computer memory, transmission system or other device certain ones of a plurality of binary bits provided by a suitable binary bit stream generating means, such as an optical reader, to form a serial stream of binary bits which represent, for example, indicia optoelectronically read from a chart. The binary bits having a predetermined one of two logic values are permitted to be transferred whereas the binary bits having the other of the two logic values are generally not retained for transferal or other use. In the preferred embodiment the bits to be retained are formed into groups of bits, referred to as bytes, and each entire byte which has at least some bits to be retained is retained. The data compressor means 2 is preferably an apparatus constructed of hardware elements (i.e., physical electrical components) as opposed to software elements (i.e., computer programs).

The compressor means 2 includes a byte counter means 4 which is responsive to a byte strobe control signal for counting the number of bytes of digital information formed by a predetermined number of consecutive binary bits in the binary bit stream (this signal is labeled "BYTE FORMED SIGNAL" in the drawing). This provides a signal identifying the location of a particular byte in the binary stream. The byte formed signal is provided by the binary bit generating means each time a predetermined number of bits is generated and placed in the binary bit stream.

The data compressor means 2 also includes binary bit signal storage means 6 for temporarily sequentially storing the binary bits within each byte of binary data.

The data compressor means 2 still further includes control means 8 which is responsive to the byte strobe control signal and to the binary bit signals for controlling the transfer to a computer means or other means of the count contained in the byte counter means 4 and of the binary bit signals stored in the binary bit signal storage means 6 when at least one of the binary bit signals in the storage means 6 has a first logic value.

The byte counter means 4 includes two up/down binary counter integrated circuits 10 and 12. These counters are responsive to the byte formed signal so that the counters are incrementally counted up whenever the byte formed signal is received. The byte counter means 4 is reset in response to a master reset signal which may also be provided by the binary bit stream generating means. When the counters 10 and 12 attain their maximum or terminal count, a carry signal is provided along a conductor 14 as a control signal to the control means 8.

So that a particular byte count can be transferred to the computer means or other means, the byte counter means 4 also includes a byte counter buffer 16 for interfacing the outputs of the counter means 10 and 12 to the computer or other means. The byte counter buffer 16 temporarily stores the byte count in response to an enable signal from the computer or other means.

The binary bit signal storage means 6 includes a shift register integrated circuit means 18 which receives through serial input means the inverse of the binary bits of the binary bit stream and which clocks this information into the shift register 18 under control of the inverse of a master timing signal provided by the binary bit stream generating means. A parallel output means of the shift register means 18 provides an output which contains eight bits (i.e., one byte in the preferred embodiment) of binary information and which is transferred to the computer or other means via a shift register buffer means 20. The shift register buffer means 20 temporarily stores the bytes from the output means of the shift register 18 in response to the aforementioned enable signal. In the preferred embodiment the parallel output means includes eight lines which are equal in number to the number of bits defining a preferred byte. Data are retained at the parallel output means only temporarily because of the continual clocking of the shift register by the master timing signal.

The control means 8 includes the logic and memory elements shown in FIG. 1. These elements include an AND gate 22, a first flip-flop 24, a second flip-flop 26, another AND gate 28, a third flip-flop 30, and a combinational logic circuit 32 having a NAND gate 34. These elements are interconnected to provide a suitable timing control signal to request, in the exemplary use of the present invention with a computer means, a direct memory access operation from the computer means whenever it is determined by the control means 8 that one byte of information is present at the output of the shift register buffer means 20 and that the corresponding number of the byte in the serial binary bit stream is present at the output of the byte counter buffer means 16 and that one bit of the information contained in the shift register buffer means 20 is of a particular logic value.

The control means 8 provides this timing control signal in response to a valid data signal from the binary bit stream generating means, the byte formed signal, the master timing signal, the binary bits and the carry signal provided along the conductor 14 extending from the counter means 10. In the preferred embodiment this timing signal is provided whenever a bit representing a logical one appears in the binary bit stream. When this occurs, the control means 8 transfers the byte containing that bit to the memory of the computer means.

In the preferred embodiment the data compressor means 2 monitors the serial stream of binary data in eight-bit sets or groupings referred to as bytes. If any byte of information contains one or more bits having a predetermined logic value, a retain data signal is generated as the aforementioned timing control signal to indicate that this byte and the number of the byte in the serial stream of bytes of binary bits is to be transferred to the computer means or to be otherwise used.

To commence the generation of the retain data signal, the AND gate 22 of the control means 8 logically combines the master timing signal and the binary bit stream signal to provide an output so that when the master timing signal and the binary bit stream signal both are at a high logic level (a logic "1") in the preferred embodiment, the AND gate 22 clocks the first flip-flop 24 to maintain a high logic level at the Q output thereof. In response both to the high level to low level transition of the particular master timing pulse during which the first flip-flop 24 was switched to a high logic output and to a high logic level being present at the Q output of the first flip-flop 24, the second flip-flop 26 is triggered so that a low logic level signal (a logical "0") is provided at the $\overline{Q}$ output thereof. This $\overline{Q}$ output provides a valid byte control enabling signal which indicates that a valid byte containing at least one bit having the predetermined logic value has been detected. This enables the AND gate 28 so that a subsequent control signal provided by the third flip-flop 30 generates the retain data signal thereby requesting a direct memory access of the computer means whereby the relevant byte of information and the corresponding byte count are transferred to an appropriate memory location of the computer means.

The control signal provided by the third flip-flop 30 is generated in response to the combinational logic circuit 32 responding to the valid data signal and the byte formed signal. Assuming that the valid data signal is a high logic level thereby indicating that valid information is being sent in the binary bit stream, when the byte formed signal goes to a high logic level, the inputs of the NAND gate 34 are set to a low logic level and a high logic level so that the set input of the third flip-flop 30 is maintained at a low logic level. However, when the byte formed signal returns to a low logic level, the inputs of the NAND gate 34 are momentarily both at a high logic level which causes a high logic level pulse to be applied to the set input of the third flip-flop 30 thereby triggering the Q output of the third flip-flop 30 to a high logic level. This high logic level and the high logic level valid byte control enabling signal are logically combined by the AND gate 28 to provide the retain data signal.

These control signals of the data compressor means 2 are provided in the aforementioned way so that the data at the outputs of the byte counter buffer means 16 and the data shift register buffer means 20 have time to stabilize prior to transferal to the memory of the computer means under control of the retain data signal.

Through the operation of the data compressor means 2, the information contained in the binary bit stream is compressed so that the information retained in response to the retain data signal primarily comprises one type of information which has been detected in the binary bit stream, but which also possibly comprises some of another type of information located adjacent the first type of information in the binary bit stream. This other type of information will be included if the first type is less than eight bits of information (i.e., is less than one byte) or is split between or among two or more consecutive bytes of information. Also retained is the byte count of each retained byte.

By way of example, assume that the data compressor means 2 is used with a device which optoelectronically reads a chart having light and dark areas. The device reads the chart by converting the light areas into high logic level binary electrical signals and by converting the dark areas into low logic level binary electrical signals. The high and low logic level signals form the binary bit stream to be compressed by the present invention. In the preferred embodiment of the present invention the high logic level signals representing the light areas constitute the one type of information primarily to be retained; the low logic level signals constitute the other type of information which is generally not to be retained. Therefore, the retained data includes those bytes containing only bits representing the light areas, those bytes containing bits representing both light and dark areas, and the count of these bytes within the binary bit stream. By knowing this, the original binary bit stream can be reconstructed by inserting in the byte locations between the retained numbered bytes bits representing the dark areas.

It is noted that the specific component values and numbers shown in the drawing are for the purpose of disclosing the specific preferred embodiment. These values and numbers are not to be taken as necessarily limiting the present invention to those specific values and numbers shown.

Thus, the present invention is well adapted to carry out the objects and attain the ends and advantages mentioned above as well as those inherent therein. While the preferred embodiment of the invention has been described for the purposes of this disclosure, numerous changes in the construction and arrangement of the parts can be made by those skilled in the art, which changes are encompassed within the spirit of this invention as defined by the appended claims.

What is claimed is:

1. An apparatus for compressing data contained in a serial stream of binary bits provided by a binary bit stream generating means, the binary bit stream generating means also providing a master timing signal and a byte formed signal, the byte formed signal designating when a predetermined number of bits forming a byte has been placed in the binary bit stream, said apparatus comprising:
   byte counter means, responsive to the byte formed signal, for counting the number of bytes in the binary bit stream, said byte counter means including:
      binary counter integrated circuit means for incrementing a count in response to the byte formed signal; and
      byte counter buffer means for retaining the count provided by said binary counter integrated circuit means;
   binary bit signal storage means, responsive to the binary bit stream and the master timing signal, for sequentially storing each binary bit within each of the bytes containing the predetermined number of binary bits, said binary bit signal storage means including:
      shift register means having serial input means for receiving the serial binary bit stream and also having parallel output means, said parallel output means having a number of output lines equal in number to the predetermined number of binary bits in one of said bytes; and
      shift register buffer means for retaining a byte of the binary bits provided on said parallel output means of said shift register means; and
   control means, responsive to the binary bit stream, the master timing signal, and the byte formed signal, for generating a control signal for retaining the count of said byte counter means and the binary bits of said binary signal storage means when at least one of the stored binary bits has a predetermined logic value, said control means including:
      first AND gate means for logically combining the master timing signal and the binary bit stream and for providing an output of the logical combination;
      first flip-flop means having an output responsive to the output of said first AND gate;
      second flip-flop means having an output responsive to the output of said first flip-flop means and the master timing signal;
      third flip-flop means having an output responsive to the byte formed signal; and
      second AND gate means for providing the control signal in response to the output of said second flip-flop means and the output of said third flip-flop means.

2. An apparatus as defined in claim 1, wherein:
   said byte counter means includes means for providing a carry signal when a terminal count is reached; and
   said second AND gate means is also responsive to said carry signal.

3. An apparatus for compressing data contained in a serial stream of binary bits provided by a binary bit stream generating means, the binary bit stream generating means also providing a master timing signal and a byte formed signal, the byte formed signal designating when a predetermined number of bits forming a byte has been placed in the binary bit stream, said apparatus comprising:
   byte counter means, responsive to the byte formed signal, for counting the number of bytes in the binary bit stream;
   binary bit signal storage means, responsive to the binary bit stream and the master timing signal, for sequentially storing each binary bit within each of the bytes containing the predetermined number of binary bits; and
   control means, responsive to the binary bit stream, the master timing signal, and the byte formed signal, for generating a control signal for retaining the count of said byte counter means and the binary bits of said binary signal storage means when at least one of the stored binary bits has a predetermined logic value, said control means including:
      first AND gate means for logically combining the master timing signal and the binary bit stream and for providing an output of the logical combination;
      first flip-flop means having an output responsive to the output of said first AND gate;
      second flip-flop means having an output responsive to the output of said first flip-flop means and the master timing signal;
      third flip-flop means having an output responsive to the byte formed signal; and
      second AND gate means for providing the control signal in response to the output of said second flip-flop means and the output of said third flip-flop means.

4. An apparatus as defined in claim 3, wherein:
   said byte counter means includes means for providing a carry signal when a terminal count is reached; and
   said second AND gate means is also responsive to said carry signal.

5. An apparatus for compressing a stream of binary bit data, comprising:
   storing means for sequentially receiving, one at a time, a plurality of groupings, each grouping including a predetermined number of consecutive bits of the data;
   identifying means for providing a signal representing the number of said groupings received by said storing means, thereby identifying the location of the grouping of the predetermined number of bits in the stream currently received in said storing means;
   determining means, responsive to the stream of binary bit data, for determining when at least one of the bits of the grouping of the predetermined number of bits currently received in said storing means has a first one of two logic values, said determining means including first combinational logic means for logically combining a timing signal with the stream of binary bit data; and means, responsive to said determining means, for providing a retain signal when said determining means determines at least one of the bits of the grouping currently received in said storing means has the first one of the two logic values, said retain signal being usable for operating said storing means and said identifying means to retain for further use the grouping of the predetermined number of bits currently in said storing means and to retain for further use the signal identifying the location of the grouping of the predetermined number of bits currently in said storing means, and wherein said storing means and said identifying means do not retain for further use the grouping of the predetermined number of bits currently in said storing means or the signal identifying the location thereof when no retain signal is provided, said means for providing a retain signal including:

means, responsive to said first combinational logic means, for providing a valid byte control enabling signal at a predetermined time after said first combinational logic means indicates at least one of the bits of the grouping of the predetermined number of bits currently received in said storing means has the first one of the two logic values;

means for providing a valid byte formed signal indicating when a respective one of said plurality of groupings has been transmitted in the stream of binary bit data; and second combinational logic means for logically combining said valid byte control enabling signal and said valid byte formed signal to provide said retain signal.

* * * * *

UNITED STATES PATENT AND TRADEMARK OFFICE
CERTIFICATE OF CORRECTION

PATENT NO. : 4,495,639

DATED : January 22, 1985

INVENTOR(S) : J.E. Mosier, J.B. Surjaatmadja, G.B. McLawhon & J. C. Penn

It is certified that error appears in the above–identified patent and that said Letters Patent are hereby corrected as shown below:

On the title page,
The inventors named on the patent should read -- John E. Mosier, Jim B. Surjaatmadja, George B. McLawhon and Jack C. Penn--.

Signed and Sealed this

Fourteenth Day of May 1985

[SEAL]

*Attest:*

DONALD J. QUIGG

*Attesting Officer*  *Acting Commissioner of Patents and Trademarks*